United States Patent
Kim

(10) Patent No.: US 7,606,054 B2
(45) Date of Patent: *Oct. 20, 2009

(54) CACHE HIT LOGIC OF CACHE MEMORY AND PROCESSOR CHIP HAVING THE SAME

(75) Inventor: Kwang-Il Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 299 days.

This patent is subject to a terminal disclaimer.

(21) Appl. No.: 11/701,674

(22) Filed: Feb. 2, 2007

(65) Prior Publication Data

US 2007/0139991 A1    Jun. 21, 2007

Related U.S. Application Data

(63) Continuation-in-part of application No. 11/093,869, filed on Mar. 30, 2005, now Pat. No. 7,193,875.

(30) Foreign Application Priority Data

May 28, 2004    (KR) ...................... 10-2004-0038331

(51) Int. Cl.
*G11C 15/00* (2006.01)
(52) U.S. Cl. ............... 365/49; 365/189.07; 365/189.05; 365/189.11; 365/185.2
(58) Field of Classification Search .................. 365/49, 365/189.07, 185.2, 189.05, 189.11
See application file for complete search history.

(56) References Cited

U.S. PATENT DOCUMENTS

| | | | |
|---|---|---|---|
| 4,959,835 A | 9/1990 | Yosida et al. | |
| 5,289,403 A | 2/1994 | Yetter | |
| 5,611,072 A | 3/1997 | Tran | |
| 5,936,892 A | 8/1999 | Wendell | |
| 6,122,710 A | 9/2000 | Kumar et al. | |
| 6,131,143 A | 10/2000 | Sakai | |
| 6,418,066 B1 | 7/2002 | Hidaka | |
| 6,462,998 B1* | 10/2002 | Proebsting | 365/205 |
| 6,807,077 B2* | 10/2004 | Noda et al. | 365/49.17 |
| 6,987,682 B2* | 1/2006 | Ma et al. | 365/49.15 |
| 7,016,229 B2 | 3/2006 | Kim | |
| 7,193,875 B2 | 3/2007 | Kim | |
| 2003/0161194 A1 | 8/2003 | Ma et al. | |
| 2004/0027845 A1 | 2/2004 | Kim et al. | |
| 2004/0114411 A1 | 6/2004 | Noda et al. | |
| 2005/0195662 A1 | 9/2005 | Ooishi | |
| 2005/0265061 A1 | 12/2005 | Kim | |

FOREIGN PATENT DOCUMENTS

| | | |
|---|---|---|
| KR | 1999-0072597 | 9/1999 |
| KR | 10-2004-0014741 | 2/2004 |

\* cited by examiner

*Primary Examiner*—Tuan T. Nguyen
(74) *Attorney, Agent, or Firm*—Mills & Onello LLP

(57) ABSTRACT

A processor chip having a cache hit logic for determining whether data required by a processor is stored in a cache memory includes a dummy cell string that operates the same as a sense amplifier for sensing a tag address stored in a tag memory cell array and a comparison logic for determining whether the sensed tag address coincides with an input tag address, a dummy sense amplifier, and a dummy comparison logic. The processor chip having the cache hit logic improves the reliability of a hit signal and operation speed is not limited.

23 Claims, 8 Drawing Sheets

CACHE HIT LOGIC OF CACHE MEMORY AND PROCESSOR CHIP HAVING THE SAME

CROSS-REFERENCE TO RELATED APPLICATIONS

This U.S. non-provisional patent application is a continuation-in-part of U.S. patent application Ser. No. 11/093,869, filed in the U.S. Patent and Trademark Office on Mar. 30, 2005 now U.S. Pat. No. 7,193,875, which claims priority under 35 U.S.C. § 119 of Korean Patent Application 2004-38331 filed in the Korean Intellectual Property Office on May 28, 2004, the entire contents of which are hereby incorporated by reference.

BACKGROUND OF THE INVENTION

The present invention relates to a cache memory, and more particularly, to a cache hit logic for determining whether a tag address stored in a tag memory coincides with an input tag address.

When various typical programs are analyzed, it is noted that reference of a memory for a given time tends to be performed only in a limited region. Such a phenomenon is referred to as locality of reference and is readily understood from the fact that typical computer programs use various program roofs and sub-routines and sequentially proceed. Also, reference of a memory of data tends to be limited to a region. A table-lookup process and a repeated process of referring to a common memory and arrangement correspond to the typical computer programs.

When the programs and data that are frequently referred to are stored in a small memory having high speed, average memory access time is reduced. Therefore, the total time required for executing programs is reduced. Such a small memory having high speed is referred to as a cache memory. According to recent technology, the cache memory is integrated with a single chip together with a processor.

The basic operation of the cache memory is in accordance with the following. When it is necessary for the processor to access the memory, the cache is first investigated. When desired words are found in the cache, the words are read. When desired words are not found, the main memory is accessed in order to read words. The block that includes the words is transmitted from the main memory to the cache memory. The size of the block is about 1 to 16 words.

The performance of a cache memory is measured by a hit ratio. When a processor refers to a memory, if desired data is found in a cache, it is referred to as hit. If the desired data is not found in the cache and is found in a main memory, it is referred to as miss. The ratio obtained by dividing the number of hits by the total number of references of a memory performed by the processor is referred to as hit ratio. The hit ratio is experimentally measured by performing typical programs of a computer to count the number of hits and the number of misses for a given time. In general, the hit ratio is no less than 0.9, which verifies the locality of reference of a memory.

A cache hit logic is a circuit for determining whether data required by a processor is stored in a cache memory and is provided in the cache memory. FIG. 1 illustrates a typical cache hit logic. FIG. 2 is a timing diagram of signals used for the cache hit logic illustrated in FIG. 1.

Referring to FIG. 1, a cache hit logic 100 includes a tag memory cell array 110, a row decoder 120, a column decoder 130, a sense amplifier and a latch circuit 140, a comparison logic 150, and an output circuit 160.

The comparison logic 150 includes XNOR gates 151 to 154 for determining whether a tag address TAGOUT<n:0> sensed and latched by the sense amplifier and the latch circuit 140 coincides with a tag address TAGADD<n:0> input from a processor (not shown). The XNOR gates 151 to 154 correspond to the bits of the tag address TAGOUT<n:0> and the bits of the tag address TAGADD<n:0>, respectively. The XNOR gates 151 to 154 output logic '1', that is, high level comparison signals X<n:0> when the input tag address bits coincide with each other.

The output circuit 160 includes AND gates 161 to 166 for outputting a high level hit signal HIT when the comparison signals X<n:0> from the XNOR gates 151 to 154 are at a high level.

However, since the output circuit 160 of the cache hit logic 100 illustrated in FIG. 1 includes AND gates of various stages, it takes a relatively long time to output the final hit signal HIT. Therefore, it is difficult to realize a high-speed cache hit logic.

FIG. 3 illustrates another circuit of a conventional cache hit logic. Referring to FIG. 3, an output circuit 360 of a cache hit logic 300 includes a PMOS pre-charge transistor 370, NMOS transistors 371 to 378, and a latch 361. The gate of the pre-charge transistor 370 and the gates of the transistors 375 to 378 are connected to a clock signal CLK. When the clock signal CLK is at a low level, a node N1 is pre-charged to a source voltage level by the pre-charge transistor 370.

When the clock signal CLK is transitioned to the high level, the pre-charge transistor 370 is turned off and the NMOS transistors 375 to 378 are turned on. At this time, comparison signals Y<n:0> output from XOR gates 351 to 354 of a comparison logic 350 turn on or turn off the NMOS transistors 371 to 374.

When the tag address TAGOUT<n:0> sensed by a tag memory cell array 310 coincides with the input tag address TAGADD<n:0>, the comparison signals Y<n:0> are at the low level. Therefore, the NMOS transistors 371 to 374 are turned off such that the first node N1 is maintained at the pre-charge level. As a result, a low level hit signal nHIT is output through the latch 361.

If even one bit between the tag address TAGOUT<n:0> sensed by the tag memory cell array 310 and the input tag address TAGADD<n:0> is not the same, a comparison signal corresponding to the bit that discords is at the high level. When even one among the NMOS transistors 371 to 374 is turned on, the first node N1 is discharged. As a result, the high level hit signal nHIT is output through the latch 361.

Delay of the output circuit 360 in the cache hit logic 300 illustrated in FIG. 3 is shorter than delay of the output circuit 160 in the cache hit logic 100 illustrated in FIG. 1. However, when the period of the clock signal CLK changes, it is not possible to guarantee the reliability of the hit signal nHIT.

FIG. 4A illustrates a setup margin after the comparison signals Y<n:0> are output until the hit signal nHIT is output when a frequency F is ½T. If the period of the clock signal CLK is properly controlled when the cache control logic 300 is designed, it is possible to secure an optimal setup margin.

However, when it takes long to sense the tag address TAGOUT<n:0> from the tag memory cell array 310 in a state where the period of the clock signal CLK is determined, the hit signal nHIT may be output at an undesired level. Also, when the period of the clock signal CLK is short, it is not possible to secure a setup margin such that the hit signal nHIT may be output at an undesired level.

On the other hand, as illustrated in FIG. 4B, when the period of the clock signal CLK is set long (F=1/T) in order to synchronize the cache memory with peripheral circuits, the setup margin is long. However, the operation speed of the cache hit logic 300 is reduced, which operates as a limitation on designing a high-speed cache memory and processor.

SUMMARY OF THE INVENTION

In order to solve the above-described problems, it is an object of the present invention to provide a processor chip having a cache hit logic capable of increasing speed of determining cache hits.

It is another object of the present invention to provide a processor chip having a cache hit logic capable of increasing speed of determining cache hits while guaranteeing reliability in determining cache hits.

According to an aspect of the present invention, a data processing system includes a processor and a cache memory configured to store data to be used at the processor and having a cache hit logic for determining whether data requested by the processor is stored in the cache memory, the cache hit logic includes a tag memory cell array having tag memory cells arranged in rows and columns to store tag addresses, a row decoder for selecting the rows, a column decoder for selecting the columns, a sense amplifier for sensing a tag address stored in a cell of the tag memory cell array selected by the row decoder and the column decoder in response to an activation of an enable signal, and a comparison circuit for comparing the sensed tag address with an input tag address when a time required for the sense amplifier to sense the tag address has passed after the enable signal is activated, to output a hit signal corresponding to the comparison result, the comparison circuit activates an output enable signal when a time required for the sense amplifier to sense the tag address has passed after the enable signal is activated.

According to one embodiment, the cache memory further comprises a data memory storing the data to be used at the processor, the data memory supplying data to the processor in response to the detection result of the cache hit logic.

According one embodiment, the cache memory further comprises a plurality of cache hit logics, a data memory divided into a plurality of ways and storing the data to be used at the processor, and a way selector selectively supplying data of ways of the data memory to the processor in response to the detection result of the cache hit logic.

The comparison circuit can include a dummy cell string having dummy cells arranged in a line in a column direction, a dummy sense amplifier for sensing a dummy address stored in a cell of the dummy cell string selected by the row decoder in response to the enable signal, and a logic circuit for activating the output enable signal when a pair of complementary dummy address bits are output from the dummy sense amplifier.

The dummy cell string can be a static random access memory(SRAM) cell string.

The cache memory further comprises a logic circuit for comparing the sensed tag address with the input tag address to output a comparison signal.

According to another aspect of the present invention, a data processing system a processor, and a cache memory configured to store data to be used at the processor and having a cache hit logic for discriminating whether data requested by the processor is stored in the cache memory, the cache hit logic includes a tag memory cell array having tag memory cells arranged in rows and columns to store tag addresses, a row decoder for selecting the rows, a column decoder for selecting the columns, a sense amplifier for sensing a tag address stored in a cell of the tag memory cell array selected by the row decoder and the column decoder in response to an activation of an enable signal, a comparison circuit for comparing the sensed tag address with an input tag address, a dummy cell string having dummy cells arranged in a column direction of the tag memory cell array, a dummy sense amplifier for sensing a dummy address stored in a dummy cell selected by the row decoder in response to the activation of the enable signal, and an output circuit for outputting the comparison signal from the comparison logic as a hit signal when the dummy sense amplifier senses the dummy address.

According to one embodiment, the dummy cell string can be a static random access memory(SRAM) cell string.

According to one embodiment, the dummy sense amplifier senses a pair of complementary dummy address bits.

According to one embodiment, the output circuit comprises a dummy comparison logic for comparing the pair of complementary dummy address bits sensed by the dummy sense amplifier with each other to output a dummy comparison signal, and an output portion for outputting the comparison signal from the comparison logic as the hit signal in response to the dummy comparison signal.

In one embodiment, the comparison logic and the dummy comparison logic are composed of the same circuit.

According to another aspect of the present invention, a data processing system a processor, and a cache memory configured to storing data to be used at the processor and having a cache hit logic for discriminating whether data requested by the processor is stored in the cache memory, the cache hit logic includes a tag memory cell array having tag memory cells arranged in rows and columns to store tag addresses, a row decoder for selecting the rows, a column decoder for selecting the columns, a sense amplifier for sensing a tag address stored in a cell of the tag memory cell array selected by the row decoder and the column decoder in response to an activation of an enable signal, a comparison circuit for comparing the sensed tag address with an input tag address, a dummy sense amplifier for receiving a source voltage and a ground voltage to output a pair of complementary dummy address bits in response to the activation of the enable signal; and an output circuit for outputting the comparison signal from the comparison logic as a hit signal when the dummy sense amplifier outputs the pair of complementary dummy address bits.

In one embodiment, the output circuit comprises a dummy comparison logic for comparing the pair of complementary dummy address bits output from the dummy sense amplifier with each other to output a dummy comparison signal, and an output portion for outputting the comparison signal from the comparison logic as the hit signal in response to the dummy comparison signal.

In one embodiment, the comparison logic and the dummy comparison logic are composed of the same circuit.

A cache hit detecting method in the cache memory having a tag memory cell array which stores a tag address and is composed of tag memory cells arranged in rows and columns, comprises (a) sensing the tag address of the tag memory cell corresponding to selected row and column in response to an enable signal, (b) comparing the sensed tag address with an input tag address, (c) activating an output enable signal when a time required for the sense amplifier to sense the tag address of the tag memory cell has passed, and (d) outputting a hit signal corresponding to the comparison result in response to the output enable signal.

In one embodiment, comparing the sensed tag address further comprises determining whether the sensed tag address coincides with the input tag address, to output the determination result.

A cache hit detecting method in the cache memory having a tag memory cell array which stores a tag address and is composed of tag memory cells arranged in rows and columns, comprises (a) sensing the tag address of the tag memory cell corresponding to selected row and column in response to an enable signal, (b) sensing the dummy address of the dummy cell corresponding to the selected row in response to the enable signal, (c) comparing the sensed tag address with an input tag address, (d) activating an output enable signal in response to the sensed dummy address when a time required for the sense amplifier to sense the tag address of the tag memory cell has passed, and (e) outputting a hit signal corresponding to the comparison result in response to the output enable signal.

According to one embodiment, the dummy cell is a static random access memory(SRAM) cell string.

In one embodiment, comparing the sensed tag address further comprises outputting the comparison result of the sensed tag address with an input tag address.

According to one embodiment, the dummy address is a pair of complementary dummy addresses.

A cache hit detecting method in the cache memory having a tag memory cell array which stores a tag address and is composed of tag memory cells arranged in rows and columns, comprises (a) sensing the tag address of the tag memory cell corresponding to selected row and column in response to a enable signal, (b) sensing the dummy address of the dummy cell in response to an enable signal, (c) comparing the sensed tag address with an input tag address, (d) activating an output enable signal in response to the sensed dummy address when a time required for the sense amplifier to sense the tag address of the tag memory cell has passed, and (e) outputting a hit signal corresponding to the comparison result in response to the output enable signal.

In one embodiment, the dummy cell is composed of a power source voltage and a ground voltage.

In one embodiment, comparing the sensed tag address further comprises outputting the comparison result of the sensed tag address with an input tag address.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENT

Figure 5:
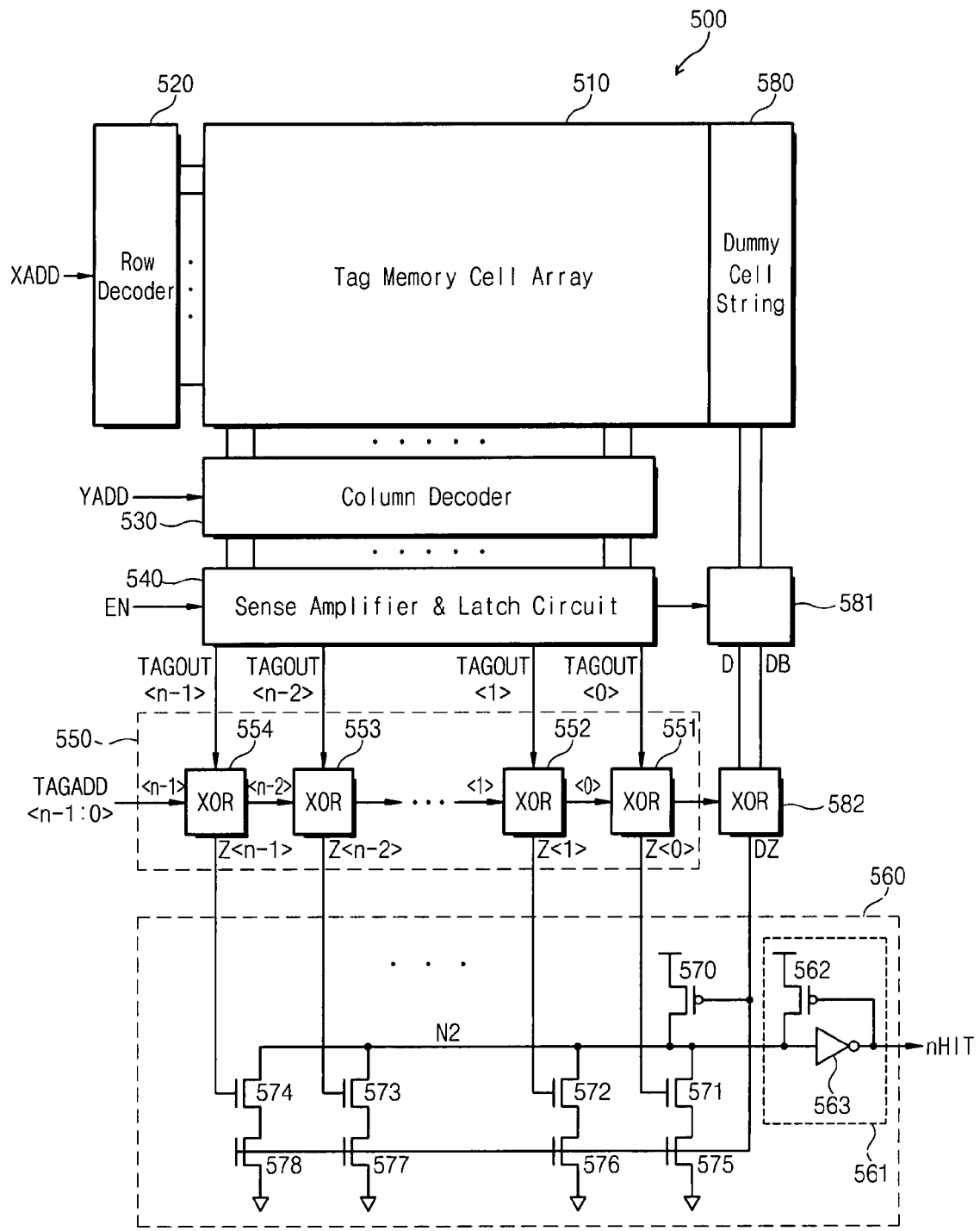
FIG. 5 illustrates a cache hit logic according to an embodiment of the present invention.

FIG. 5 illustrates a cache hit logic 500 according to an embodiment of the present invention. The cache hit logic 500 includes a tag memory cell array 510, a row decoder 520, a column decoder 530, a sense amplifier and latch circuit 540, a comparison logic 550, an output circuit 560, a dummy cell string 580, a dummy sense amplifier 581, and a dummy comparison logic 582.

The tag memory cell array 510 includes a plurality of memory cells arranged in rows and columns. The dummy cell string 580 includes dummy memory cells arranged in a line in the column direction of the tag memory cell array 510. In one embodiment, each of the tag memory cell array 510 and the dummy cell string 580 includes a static random access memory (SRAM) cells.

The row decoder 520 selects a row among the rows of the tag memory cell array 510 in response to a row address XADD and a row among the rows of the dummy cell string 580. The column decoder 530 selects n (n is a positive integer equal to or larger than 1) columns among the columns of the tag memory cell array 510 in response to a column address YADD. For example, when the tag memory cell array 510 includes n columns and each of the n columns is connected to 4 sub-columns, a total of n sub columns are selected one by one among the 4 sub-columns connected to each of the n columns by a 2 bit column address YADD<1:0>. That is, the tag memory cell array 510 includes n*4 columns and n columns are selected by the 2 bit column address YADD<1:0>.

The sense amplifier and latch circuit 540 senses and latches a row selected by the row decoder 520 and n bit tag addresses TAGOUT<n−1:0> connected to n columns selected by the column decoder 530 in response to the activation of an enable signal EN.

The comparison logic 550 includes n XOR gates 551 to 554 corresponding to the bits of the tag address TAGOUT<n−1:0>. The XOR gates 551 to 554 receive the corresponding bit of the tag address TAGOUT<n−1:0> from the sense amplifier and latch circuit 540 and the corresponding bit of an input tag address TAGADD<n−1:0> to compare the corresponding bit of the tag address TAGOUT<n−1:0> with the corresponding bit of the tag address TAGADD<n−1:0>. The XOR gates 551 to 554 output a logic '0', that is, low level comparison signal when the two input bits coincide with each other and output a logic '1', that is, high level comparison signal when the two input bits do not coincide with each other. Comparison signals Z<n−1:0> output from the comparison logic 550 are provided to the output circuit 560.

On the other hand, the address stored in the dummy cell of the dummy cell string 580 selected by the row decoder 520 is provided to the dummy sense amplifier 581. As noted above, the dummy cell string 580 is composed of an SRAM cell string. As is well known, an SRAM senses data stored in a cell through a pair of complementary signal lines BL and /BL. The dummy sense amplifier 581 provides a pair of complementary address bits D and DB sensed in response to the activation of the enable signal EN to the dummy comparison logic 582. The dummy sense amplifier 581 sets the pair of address bits D and DB at the low level, when the enable signal EN is deactivated.

The dummy comparison logic 582 is composed of XOR gates like the comparison logic 550. Since the pair of address bits D and DB from the dummy sense amplifier 581 always have complementary values, the dummy comparison logic 582 outputs a high level dummy comparison signal DZ when the pair of address bits D and DB are input from the dummy sense amplifier 581.

The output circuit 560 includes a PMOS transistor 570 that acts as a pre-charge transistor, NMOS transistors 571 to 578, and a latch 561. The pre-charge transistor 570 has a source connected to a source voltage, a drain connected to a node N2, and a gate connected to the dummy comparison signal DZ. The first transistors 571 to 574 correspond to the XOR gates 551 to 554 of the comparison logic 550, respectively. Each of the first transistors 571 to 574 has a drain connected to the node N2, a source, and a gate connected to a comparison signal from the corresponding XOR gate. The second transistors 575 to 578 correspond to the first transistors 571 to 574, respectively. Each of the second transistors 575 to 578 has a drain connected to the source of the corresponding first transistor, a source connected to a ground voltage, and a gate connected to the dummy comparison signal DZ from the dummy comparison logic 582. The latch 561 includes a PMOS transistor 562 and an inverter 563.

Since the dummy comparison signal DZ from the dummy comparison logic 582 is at the low level while the enable signal EN is deactivated, the node N2 is pre-charged to a source voltage level by the pre-charge transistor 570.

The row address XADD, the column address YADD, and the tag address TAGADD<n−1:0> are input and the enable signal EN is activated, the sense amplifier and latch circuit 540 senses and latches the tag address TAGOUT<n−1:0> stored in the tag memory cell array 510. At the same time, the dummy sense amplifier 581 outputs the pair of complementary dummy address bits D and DB in response to the activation of the enable signal EN.

The comparison logic 550 compares the sensed tag address TAGOUT<n−1:0> with the input tag address TAGADD<n−1:0> to output the comparison signals Z<n−1:0>. The dummy comparison logic 582 outputs the high level dummy comparison signal DZ.

The pre-charge transistor 570 is turned off and the second transistors 575 to 578 are turned on by the high level dummy comparison signal DZ. Therefore, the node N2 is maintained at the pre-charged level or is discharged in accordance with the comparison signals Z<n−1:0> from the XOR gates 551 to 554. When the sensed tag address TAGOUT<n−1:0> completely coincides with the input tag address TAGADD<n−1:0>, the comparison signals Z<n−1:0> are at the low level such that the node N2 is maintained at the pre-charged level. When one or more bits discord between the sensed tag address TAGOUT<n−1:0> and the input tag address TAGADD<n−1:0>, the node N2 is discharged through the transistors corresponding to the bits that discord among the first transistors 571 to 574. The voltage level of the node N2 is output through the latch 561 as the hit signal nHIT.

Figure 6:
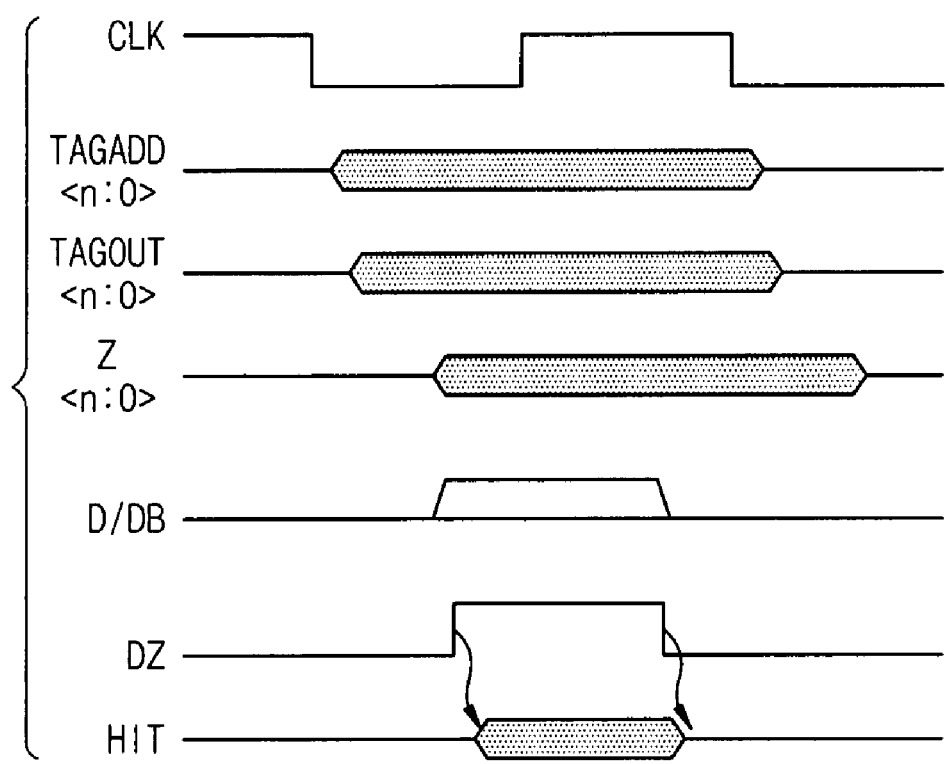
FIG. 6 is a timing diagram of signals used by the cache hit logic illustrated in FIG. 5.

Since the sense amplifier 540 and the dummy sense amplifier 581 simultaneously operate in response to the enable signal EN and the comparison logic 550 and the dummy comparison logic 582 simultaneously perform a comparison operation, the point of time at which the hit signal nHIT is output is dependent on the point of time of the sense operation of the sense amplifier 540 and the point of time of the comparison operation of the comparison logic 550. Therefore, the cache hit logic 500 according to the present invention can minimize the delay of time caused by the output circuit 560 as illustrated in FIG. 6.

Figure 3:
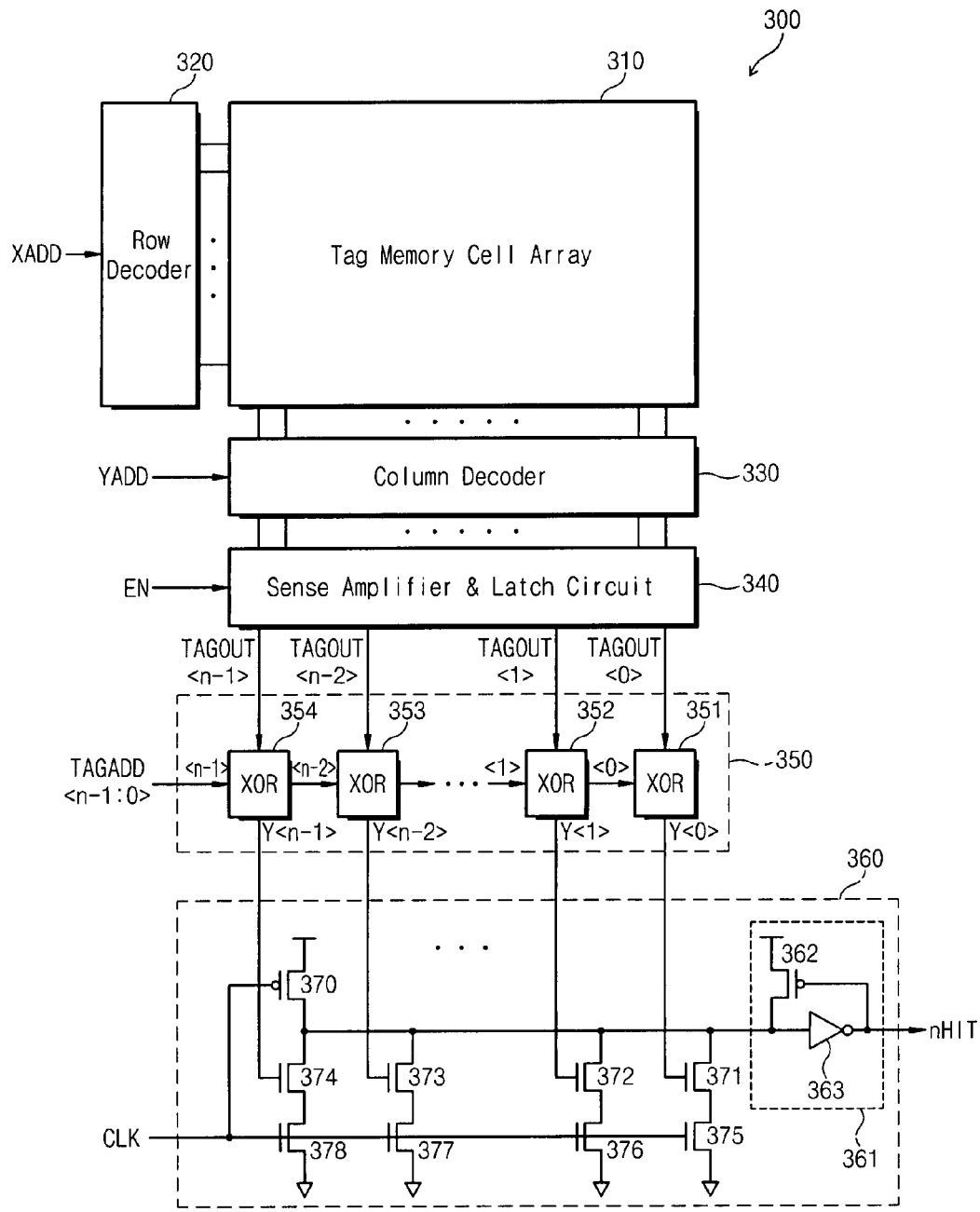
FIG. 3 illustrates another circuit of a conventional cache hit logic.
Figure 4A:
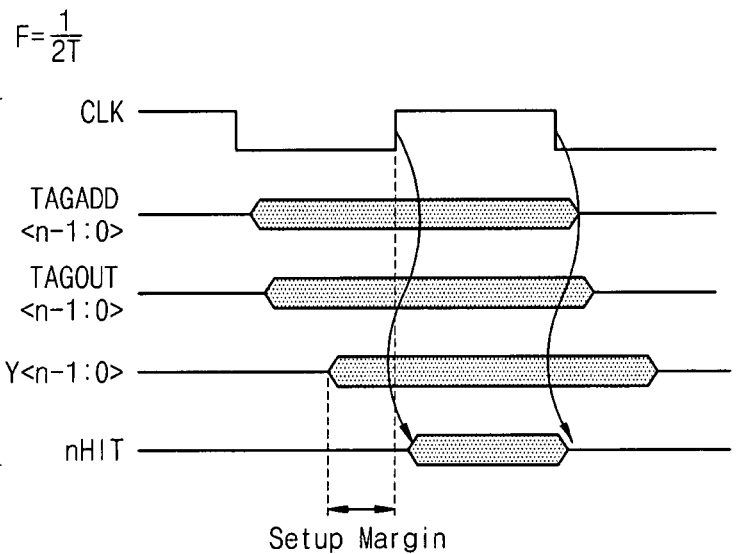
FIG. 4A illustrates a setup margin after comparison signals are output until a hit signal nHIT is output when a frequency F is ½T.
Figure 4B:
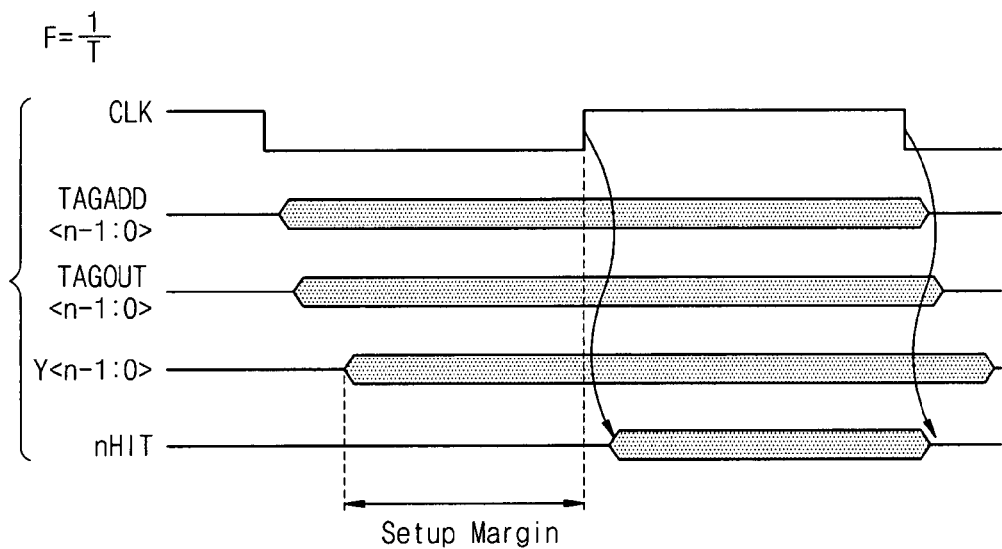
FIG. 4B illustrates a setup margin after the comparison signals are output until the hit signal nHIT is output when the frequency F is 1/T.

According to the conventional cache hit logic 300 illustrated in FIG. 3, the reliability of the hit signal nHIT cannot be guaranteed or there is a limitation on the operation speed in accordance with the relationship between the point of time at which the comparison signals Y<n−1:0> are output from the comparison logic 350 and the period of the clock signal CLK.

The cache hit logic 500 according to the invention includes the dummy cell string 580, the dummy sense amplifier 581, and the dummy comparison logic 582 in order to turn on the second transistors 575 to 578. Since the operation speed of the dummy sense amplifier 540 and the dummy comparison logic 582 is equal to the operation speed of the sense amplifier and latch circuit 540 and the comparison logic 550, the reliability of the hit signal nHIT is guaranteed and the operation speed is not limited.

Figure 7:
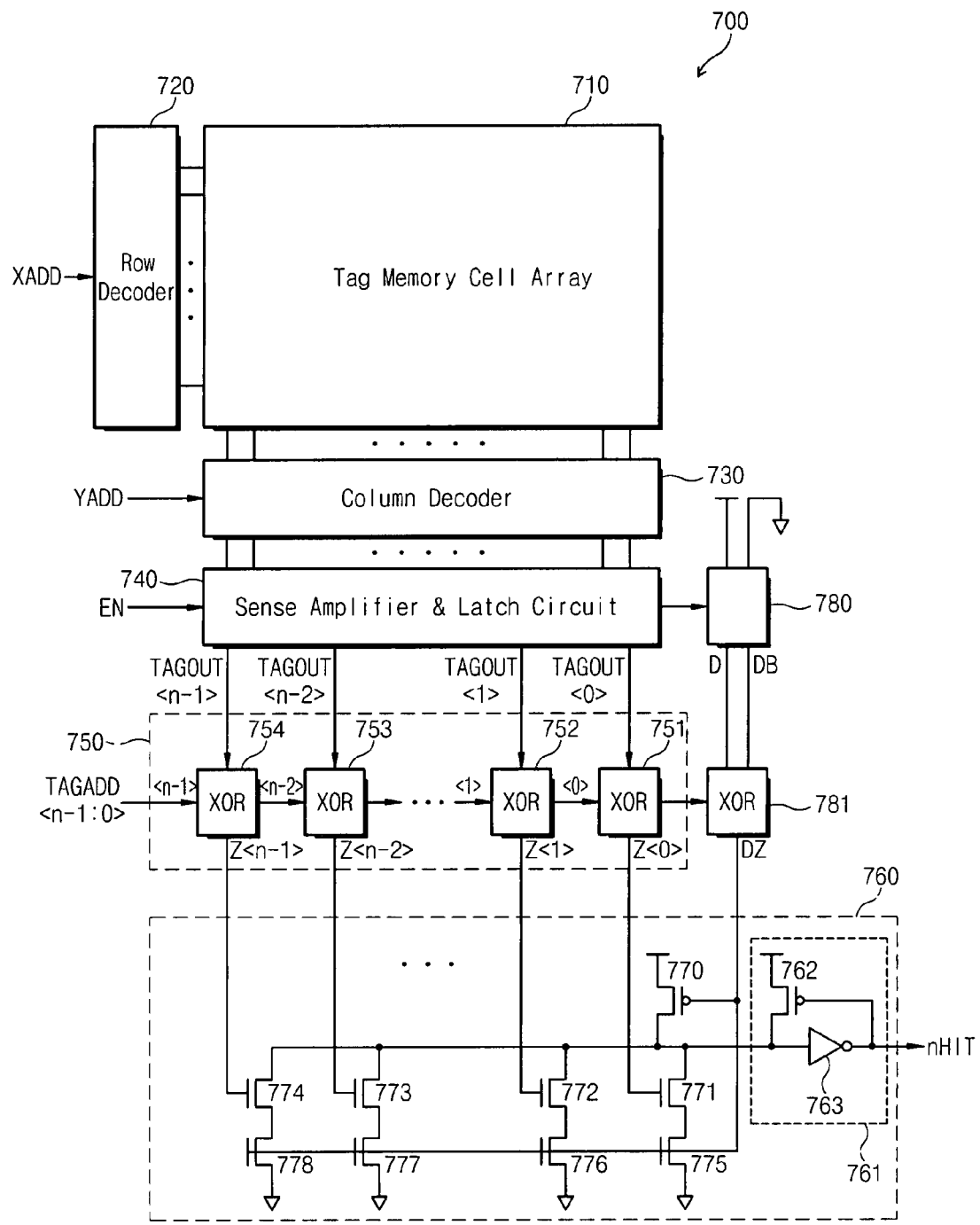
FIG. 7 illustrates a cache hit logic according to another embodiment of the present invention.

FIG. 7 illustrates a cache hit logic according to another embodiment of the present invention. Unlike the cache hit logic 500 illustrated in FIG. 5 which includes the dummy cell string 580, the cache hit logic 700 illustrated in FIG. 7 does not include a dummy cell string, and the source voltage and the ground voltage are connected to the two input ports of the sense amplifier 780, respectively. The sense amplifier 780 senses the source voltage and the ground voltage when the enable signal EN is activated to output a pair of complementary signals, that is, the dummy address bits D and DB. The structures and operations of the remaining circuits of the cache hit logic 700 are the same as the structures and operations of the remaining circuits of the cache hit logic 500. Therefore, description thereof will not be repeated.

According to the cache hit logic 700 illustrated in FIG. 7, the sense amplifier and the latch circuit 740 starts the operation of sensing the tag address TAGOUT<n−1:0> stored in the tag memory cell array 710 in response to the activation of the enable signal EN and, at the same time, outputs the dummy address bits D and DB. Therefore, according to the cache hit logic 700, the reliability of the hit signal nHIT is guaranteed and the operation speed is not limited.

As described above, according to the present invention, the speed at which the cache hit logic determines cache hits and reliability in determining the cache hits are improved.

Figure 8:
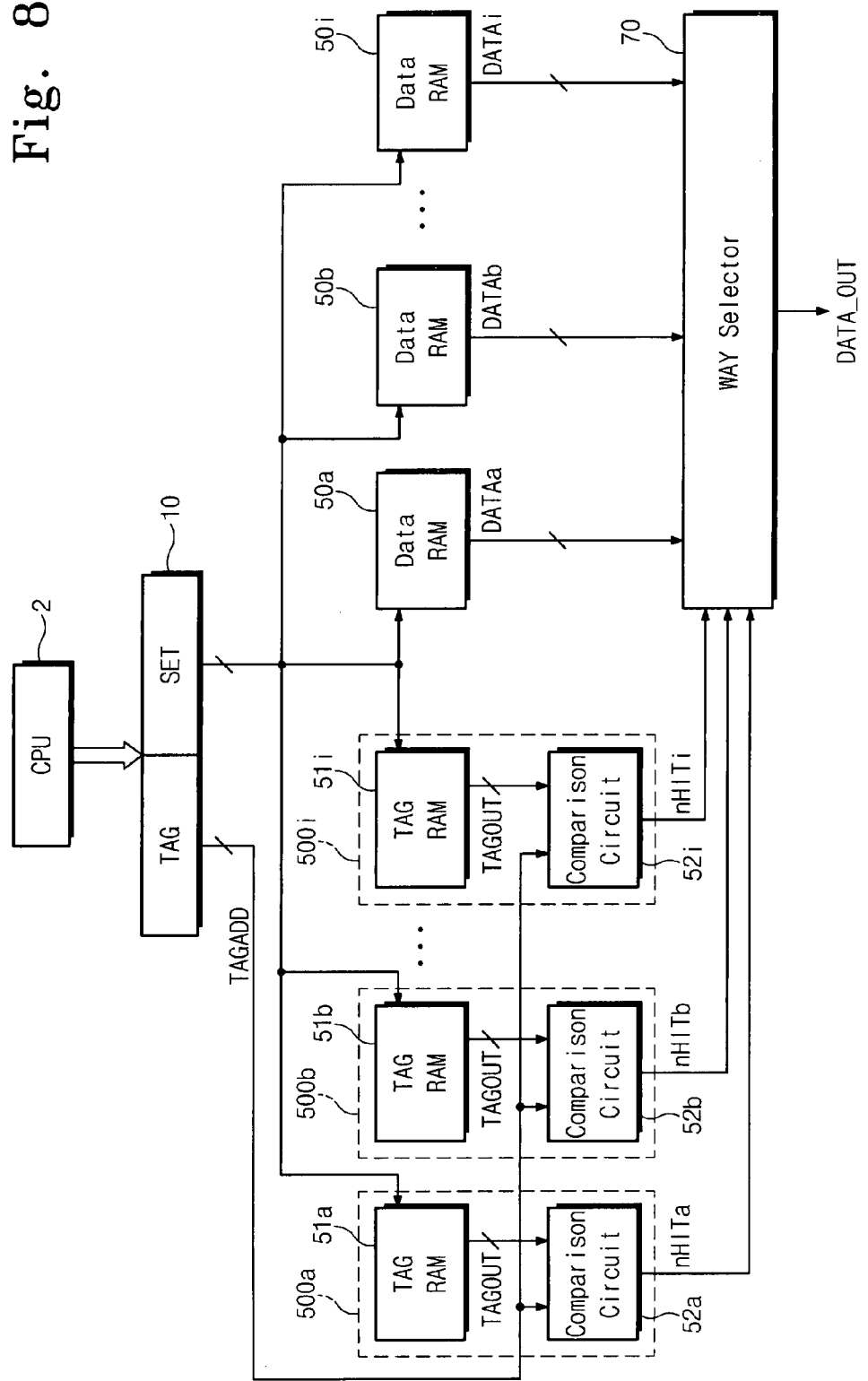
FIG. 8 illustrates a cache memory having the cache hit logic of the invention according to an embodiment of the present invention.

FIG. 8 illustrates a cache memory having the cache hit logic of the invention according to an embodiment of the present invention.

The cache memory illustrated in FIG. 8 is a Multi-Way set-associative type cache memory. An exemplary Multi-Way set-associative type cache memory is disclosed in U. S. Pat. No. 6,131,143, entitled, "MULTI-WAY ASSOCIATIVE STORAGE TYPE CACHE MEMORY," the contents of which are herein incorporated by reference.

Referring to FIG. 8, the cache memory comprises a plurality of cache hit logics 500a-500i, a plurality of data memories 50a-50i, and a way selector 70. The cache hit logics 500a-500i include corresponding tag memories 51a-51i and corresponding comparison circuits 52a-52i, respectively. Each of the tag memories 51a-51i includes a tag memory cell array 510, a row decoder 520, a column decoder 530, and a sense amplifier and latch circuit 540, which are illustrated in FIG. 5. Each of the comparison circuits 52a-52i includes a dummy cell string 580, a dummy sense amplifier 581, a dummy comparison logic 582, and an output circuit 560, which are illustrated in FIG. 5.

Each of the tag and data memories 51a-51i and 50a-50i includes a plurality of cell arrays arranged in rows and columns. Herein, rows mean sets.

Figure 1:
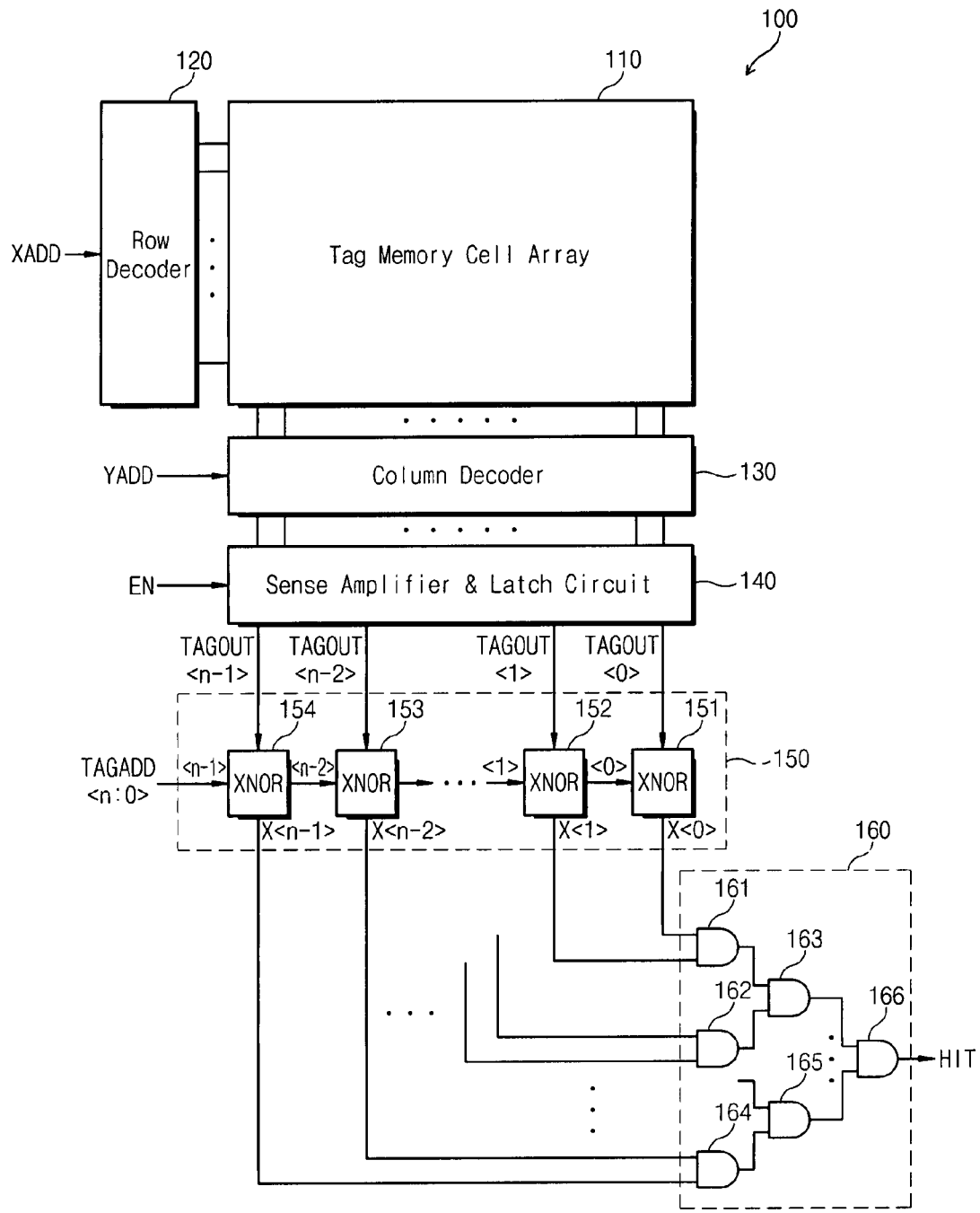
FIG. 1 illustrates a conventional cache hit logic.
Figure 2:
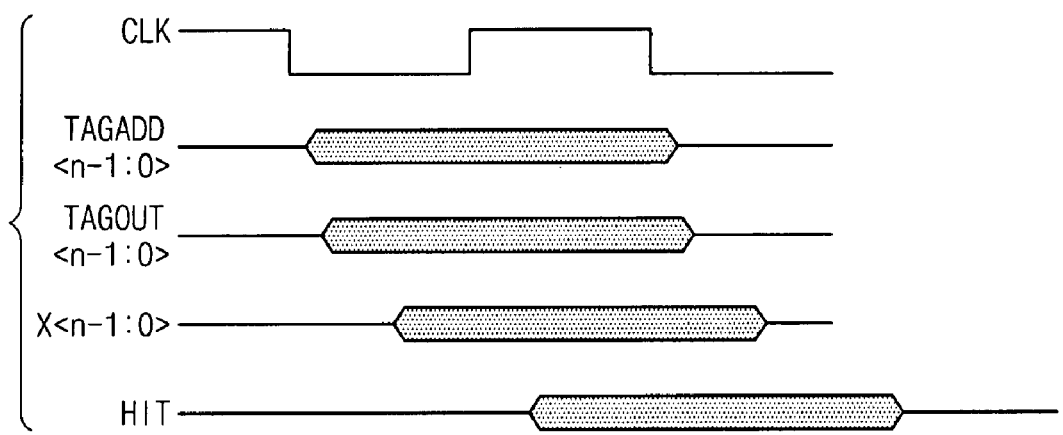
FIG. 2 is a timing diagram of signals used by the cache hit logic illustrated in FIG. 1.

Tag addresses to be compared with a tag address TAG from a CPU 2 are stored respectively in the tag memories 51a-51i. Data to be accessed by the CPU 2 are stored respectively in the data memories 50a-50i. Symbols 'a' and 'i' of the reference numerals 30a-30i and 40a-40i in FIG. 1 indicate "ways".

The tag memories 51a-51i correspond to data memories 50a-50i, respectively. Tag addresses stored in the respective tag memories 51a-51i designate sets of corresponding data memories 50a-50i.

In FIG. 8, an address provided to the cache memory from the CPU 2 through an address bus is composed of a tag address TAG and a set address SET. The set address SET is provided to the tag memories 51a-51i and the data memories 50a-50i, respectively.

The set address SET is decoded by the tag memories 51a-51 and the data memories 50a-50i, respectively. The tag memories 51a-51 provide tag addresses, which are stored in sets selected by the decoded set address SET, to corresponding comparison circuits 52a-52i, respectively.

The data memories 50a-50i provide data, which is stored in sets selected by the decoded set address SET, to the way selector 70.

The comparison circuits 52a-52i compare tag addresses TAGOUT from corresponding tag memories 51a-51i with the tag address TAG from the CPU 2, respectively, and output hit signals nHITa-nHITi as the comparison results, When sense amplifiers and latch circuits in tag memories 51a-52i perform an operation of sensing tag addresses TAGOUT, stored in the tag memory cell arrays, in response to an activation of the enable signal EN, the comparison circuits 52a-52i sense a pair of complementary dummy address bits stored in a cell of the dummy cell string through a dummy sense amplifier and a dummy comparison logic, respectively, and output sensed dummy address bits D and DB, respectively. Therefore, according to the cache hit logics 500a-500i, it is possible to guarantee the reliability of the hit signal nHIT and to remove elements of limiting the operation speed, that is, to improve the operation speed.

The way selector 70 operates responsive to hit signals nHITa-nHITi from the cache hit logics 500a-500i, and selects one of data DATAa to DATAi from the data memories 50a-50i.

In the case that tag addresses TAGOUT from corresponding tag memories 51a-51i coincide with the TAG address TAG from the CPU 2, the comparison circuits 52a-52i output activated hit signals nHITa-nHITi, respectively. For example, in the case that the tag address TAGOUT from the tag memory 51a coincides with the tag address TAG from the CPU 2, the comparison circuit 52a outputs the activated hit signal nHITa.

In a case where the comparison circuit 52a outputs the activated hit signal nHITa and the comparison circuits 52b-52i output inactivated hit signals nHITb-NITi, the way selector 70 outputs the data from the data memory 50a in response to the activated hit signal nHITa. At this time, the outputted data is data stored in the set of the data memory 40a which is designated by the set address SET.

Thus, in the case that tag addresses stored in tag memories 51a-51i coincide with the tag address TAG from the CPU 2, the way selector 70 outputs data of a data memory which corresponds to a tag memory with the same tag address as a tag address TAG. In the case that tag addresses stored in tag memories 51a-51i don't coincide with the tag address TAG from the CPU 2, the CPU 2 accesses a main memory instead of the cache memory. Data of the main memory accessed by the CPU 2 is stored in data memories 50a-50i of the cache memory.

If the cache memory comprises one cache hit logic and one data memory, it does not need the way selector 70. In this case, data in the data memory is outputted in response to the hit signal from the cache hit logic. The cache memory with one cache hit logic and one data memory operates the same as that illustrated in FIG. 8, and description thereof will not be repeated.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A data processing system comprising:
   a processor; and
   a cache memory configured to store data to be used at the processor and having a cache hit logic for determining whether data requested by the processor is stored in the cache memory, wherein
   the cache hit logic includes:
   a tag memory cell array having tag memory cells arranged in rows and columns to store tag addresses;
   a row decoder for selecting the rows;
   a column decoder for selecting the columns;
   a sense amplifier for sensing a tag address stored in a cell of the tag memory cell array selected by the row decoder and the column decoder in response to an activation of an enable signal; and
   a comparison circuit for comparing the sensed tag address with an input tag address when a time required for the sense amplifier to sense the tag address has passed after the enable signal is activated, to output a hit signal corresponding to the comparison result, wherein the comparison circuit activates an output enable signal when a time required for the sense amplifier to sense the tag address has passed after the enable signal is activated.

2. The data processing system as set forth in claim 1, wherein the cache memory further comprises:
   a data memory storing the data to be used at the processor, the data memory supplying data to the processor in response to the determination result of the cache hit logic.

3. The data processing system as set forth in claim 1, wherein the cache memory further comprises:
   a plurality of cache hit logics;
   a data memory divided into a plurality of ways and storing the data to be used at the processor; and
   a way selector selectively supplying data of ways of the data memory to the processor in response to the determination result of the cache hit logic.

4. The data processing system as set forth in claim 1, wherein the comparison circuit comprises:
   a dummy cell string having dummy cells arranged in a line in a column direction;
   a dummy sense amplifier for sensing a dummy address stored in a cell of the dummy cell string selected by the row decoder in response to the enable signal; and
   a logic circuit for activating the output enable signal when a pair of complementary dummy address bits are output from the dummy sense amplifier.

5. The data processing system as set forth in claim 1, wherein the dummy cell string is a static random access memory(SRAM) cell string.

6. The data processing system as set forth in claim 1, wherein the cache memory further comprises a logic circuit for comparing the sensed tag address with the input tag address to output a comparison signal.

7. A data processing system comprising:
   a processor; and a cache memory configured to store data to be used at the processor and having a cache hit logic for determining whether data requested by the processor is stored in the cache memory, wherein
the cache hit logic includes:
a tag memory cell array having tag memory cells arranged in rows and columns to store tag addresses;
a row decoder for selecting the rows;
a column decoder for selecting the columns;
a sense amplifier for sensing a tag address stored in a cell of the tag memory cell array selected by the row decoder and the column decoder in response to an activation of an enable signal;
a comparison circuit for comparing the sensed tag address with an input tag address;
a dummy cell string having dummy cells arranged in a column direction of the tag memory cell array;
a dummy sense amplifier for sensing a dummy address stored in a dummy cell selected by the row decoder in response to the activation of the enable signal; and
an output circuit for outputting the comparison signal from the comparison logic as a hit signal when the dummy sense amplifier senses the dummy address.

8. The data processing system as set forth in claim 7, wherein the dummy cell string is a static random access memory(SRAM) cell string.

9. The data processing system as set forth in claim 8, wherein the dummy sense amplifier senses a pair of complementary dummy address bits.

10. The data processing system as set forth in claim 9, wherein the output circuit comprises:
a dummy comparison logic for comparing the pair of complementary dummy address bits sensed by the dummy sense amplifier with each other to output a dummy comparison signal; and
an output portion for outputting the comparison signal from the comparison logic as the hit signal in response to the dummy comparison signal.

11. The data processing system as set forth in claim 10, wherein the comparison logic and the dummy comparison logic are composed of the same circuit.

12. A data processing system comprising:
a processor; and
a cache memory configured to store data to be used at the processor and having a cache hit logic for determining whether data requested by the processor is stored in the cache memory, wherein
the cache hit logic includes:
a tag memory cell array having tag memory cells arranged in rows and columns to store tag addresses;
a row decoder for selecting the rows;
a column decoder for selecting the columns;
a sense amplifier for sensing a tag address stored in a cell of the tag memory cell array selected by the row decoder and the column decoder in response to an activation of an enable signal;
a comparison circuit for comparing the sensed tag address with an input tag address;
a dummy sense amplifier for receiving a source voltage and a ground voltage to output a pair of complementary dummy address bits in response to the activation of the enable signal; and
an output circuit for outputting the comparison signal from the comparison logic as a hit signal when the dummy sense amplifier outputs the pair of complementary dummy address bits.

13. The data processing system as set forth in claim 12, wherein the output circuit comprises:
a dummy comparison logic for comparing the pair of complementary dummy address bits output from the dummy sense amplifier with each other to output a dummy comparison signal; and
an output portion for outputting the comparison signal from the comparison logic as the hit signal in response to the dummy comparison signal.

14. The data processing system as set forth in claim 13, wherein the comparison logic and the dummy comparison logic are composed of the same circuit.

15. A cache hit detection method in a cache memory having a tag memory cell array which stores a tag address and is composed of tag memory cells arranged in rows and columns, the method comprising:
(a) sensing the tag address of the tag memory cell corresponding to a selected row and column in response to an enable signal;
(b) comparing the sensed tag address with an input tag address;
(c) activating an output enable signal when a time required for the sense amplifier to sense the tag address of the tag memory cell has passed; and
(d) outputting a hit signal corresponding to the comparison result in response to the output enable signal.

16. The cache hit detection method in a cache memory as set forth in claim 15, wherein comparing the sensed tag address further comprises determining whether the sensed tag address coincides with the input tag address, to output the determination result.

17. A cache hit detection method in a cache memory having a tag memory cell array which stores a tag address and is composed of tag memory cells arranged in rows and columns, the method comprising:
(a) sensing the tag address of the tag memory cell corresponding to a selected row and column in response to an enable signal;
(b) sensing the dummy address of the dummy cell corresponding to the selected row in response to the enable signal;
(c) comparing the sensed tag address with an input tag address;
(d) activating an output enable signal in response to the sensed dummy address when a time required for the sense amplifier to sense the tag address of the tag memory cell has passed; and
(e) outputting a hit signal corresponding to the comparison result in response to the output enable signal.

18. The cache hit detection method in a cache memory as set forth in claim 17, wherein the dummy cell is a static random access memory(SRAM) cell string.

19. The cache hit detection method in a cache memory as set forth in claim 17, wherein comparing the sensed tag address further comprises outputting the comparison result of the sensed tag address with an input tag address.

20. The cache hit detection method in a cache memory as set forth in claim 17, wherein the dummy address is a pair of complementary dummy addresses.

21. A cache hit detection method in a cache memory having a tag memory cell array which stores a tag address and is composed of tag memory cells arranged in rows and columns, the method comprising:
(a) sensing the tag address of the tag memory cell corresponding to a selected row and column in response to an enable signal;

(b) sensing the dummy address of the dummy cell in response to the enable signal;
(c) comparing the sensed tag address with an input tag address;
(d) activating an output enable signal in response to the sensed dummy address when a time required for the sense amplifier to sense the tag address of the tag memory cell has passed; and
(e) outputting a hit signal corresponding to the comparison result in response to the output enable signal.

22. The cache hit detection method in a cache memory as set forth in claim 21, wherein the dummy cell is composed of a power source voltage and a ground voltage.

23. The cache hit detection method in a cache memory as set forth in claim 21, wherein comparing the sensed tag address further comprises outputting the comparison result of the sensed tag address with an input tag address.

* * * * *